United States Patent [19]
Mahulikar et al.

[11] Patent Number: 5,367,196
[45] Date of Patent: Nov. 22, 1994

[54] MOLDED PLASTIC SEMICONDUCTOR PACKAGE INCLUDING AN ALUMINUM ALLOY HEAT SPREADER

[75] Inventors: Deepak Mahulikar, Madison, Conn.; Jeffrey S. Braden, Livermore, Calif.; Szuchain F. Chen, Orange, Conn.

[73] Assignee: Olin Corporation, New Haven, Conn.

[21] Appl. No.: 946,119

[22] Filed: Sep. 17, 1992

[51] Int. Cl.$^5$ .................. H01L 23/28; H01L 23/02; H01L 23/48; H01L 29/44
[52] U.S. Cl. ................ 257/787; 257/690; 257/675; 257/706; 257/708; 257/709; 257/729
[58] Field of Search ............ 257/706, 690, 787, 678, 257/708, 729; 205/189, 112; 361/386; 174/52.4

[56] References Cited
U.S. PATENT DOCUMENTS

| | | | |
|---|---|---|---|
| 3,770,600 | 11/1973 | Sautter et al. | 204/58 |
| 3,784,440 | 1/1974 | Grunwald et al. | 428/412 |
| 4,092,697 | 5/1978 | Spaight | 361/386 |
| 4,121,980 | 10/1978 | Gohausen et al. | 204/35 N |
| 4,461,924 | 7/1984 | Butt | 174/52.4 |
| 4,589,010 | 5/1986 | Tateno et al. | 257/670 |
| 4,640,625 | 2/1987 | Kushida | 368/280 |
| 4,707,724 | 11/1987 | Suzuki et al. | 257/677 |
| 4,713,150 | 12/1987 | Hornbostel et al. | 204/38.3 |
| 4,766,095 | 8/1988 | Hiroshi | 437/217 |
| 4,767,674 | 8/1988 | Shirai et al. | 428/461 |
| 4,888,449 | 12/1989 | Crane et al. | 174/52.4 |
| 4,926,242 | 5/1990 | Itoh et al. | 257/720 |
| 4,939,316 | 7/1990 | Mahulikar et al. | 174/52.4 |
| 4,994,314 | 2/1991 | Rosenfeld et al. | 428/36.92 |
| 5,013,871 | 5/1991 | Mahulikar | 174/52.4 |
| 5,015,803 | 5/1991 | Mahulikar et al. | 174/52.4 |
| 5,023,398 | 6/1991 | Mahulikar et al. | 257/708 |
| 5,038,940 | 7/1991 | Winton et al. | 428/174 |
| 5,055,967 | 10/1991 | Sukonnik et al. | 361/706 |
| 5,066,368 | 11/1991 | Pasqualoni et al. | 205/112 |
| 5,073,521 | 12/1991 | Braden | 437/209 |
| 5,098,796 | 3/1992 | Lin et al. | 428/607 |
| 5,098,864 | 3/1992 | Mahulikar | 437/221 |
| 5,122,858 | 6/1992 | Mahulikar | 257/753 |
| 5,124,783 | 6/1992 | Sawaya | 257/724 |
| 5,155,299 | 10/1992 | Mahulikar et al. | 257/709 |
| 5,181,969 | 1/1993 | Komatsubara et al. | 148/552 |

OTHER PUBLICATIONS

Metals Handbook ®, 9th Edition, vol. 5 at pp. 600–607, 1982.

*Primary Examiner*—Jerome Jackson
*Assistant Examiner*—Teresa M. Arroyo
*Attorney, Agent, or Firm*—Gregory S. Rosenblatt

[57] ABSTRACT

There is provided a molded plastic electronic package having improved thermal dissipation. A heat spreader, formed from aluminum or an aluminum alloy, is partially encapsulated in the molding resin. Forming a black anodization layer on the surface of the heat spreader improves both thermal dissipation and adhesion to the molding resin.

29 Claims, 2 Drawing Sheets

MOLDED PLASTIC SEMICONDUCTOR PACKAGE INCLUDING AN ALUMINUM ALLOY HEAT SPREADER

BACKGROUND OF THE INVENTION

The present invention relates to a molded plastic package for encapsulating a semiconductor device. More particularly, an anodized aluminum heat spreader is at least partially embedded in the molding resin enhancing the dissipation of heat from the device.

Molded plastic electronic packages provide environmental protection to integrated circuit devices. Packages such as the QFP (plastic quad flat package) and PLCC (plastic-leaded chip carrier) protect an encapsulated device from contaminants such as moisture as well as from mechanical shock. One molded plastic package is illustrated in U.S. Pat. No. 4,707,724 to Suzuki et al, which is incorporated by reference in its entirety herein. The package has a leadframe with a centrally positioned die attach pad. The semiconductor device is bonded to the pad and electrically interconnected to the inner ends of the leadframe. A polymer molding resin encapsulates the device, die attach pad and inner lead ends.

One disadvantage with molded plastic packages is poor thermal dissipation. During operation, the semiconductor device generates heat which must be removed to maintain the operating integrity of the device. While some heat is dissipated through the bonding wires and leadframe, the remainder is absorbed into the molding resin. The molding resin is a poor thermal conductor so the device temperature will increase unless the power provided to the device is limited.

Incorporating a heat spreader into the molded plastic package provides an enhanced path for thermal dissipation. As a result, more power may be provided to the semiconductor device without a resultant excessive increase in device temperature. The heat spreader, which is usually copper, is embedded in the molding resin, usually below the die attach paddle, reducing the amount of molding resin through which heat must pass to reach a surface of the package.

In addition to copper, heat spreaders formed from composites having a copper or aluminum component and a lower coefficient of thermal expansion component are disclosed in U.S. Pat. No. 5,015,803 to Mahulikar et al, which is incorporated in its entirety herein by reference.

Copper based heat spreaders provide good thermal dissipation, but do not adhere well to a molding resin and increase the weight of the package. Further, the copper catalyzes the degradation of some molding resins.

A method of improving the adhesion of a heat spreader to the molding resin is to form a plurality of grooves in the heat spreader to channel resin flow for mechanical locking as disclosed in U.S. Pat. No. 4,589,010 to Tateno et al. Alternatively, the copper is coated with a material having better adhesion to the molding resin as disclosed in U.S. Pat. No. 4,888,449 to Crane et al.

These approaches do not reduce the weight of the package and do not maximize the transfer of heat from a semiconductor device to a surface of the package.

SUMMARY OF THE INVENTION

Accordingly, it is an object of the invention to provide a molded plastic electronic package having a partially embedded aluminum based heat spreader. It is a feature of the invention that the thermal resistance between a semiconductor device and the heat spreader is minimized by the use of a thermal grease or a B-staged epoxy. Yet another feature of the invention is that the heat spreader is at least partially coated with an anodization layer. It is an advantage of the invention that this anodization layer provides a uniformly rough surface having improved adhesion to the molding resin. Yet another advantage of the heat spreader is that its weight is significantly less than that of a similar geometry copper heat spreader.

In accordance with the invention, there is provided a semiconductor package. The package encapsulates at least one semiconductor device. An aluminum or aluminum alloy heat spreader which is at least partially coated with an anodization layer is in thermal contact with the semiconductor device. A leadframe is also provided. The leadframe has a plurality of inner and outer leads with the inner leads electrically interconnected to the device. A molding resin encapsulates the device, the inner leads of the leadframe and at least a portion of the heat spreader.

The above stated objects, features and advantages will become more apparent from the specification and drawings which follow.

DESCRIPTION OF THE PREFERRED EMBODIMENTS

Figure 1:
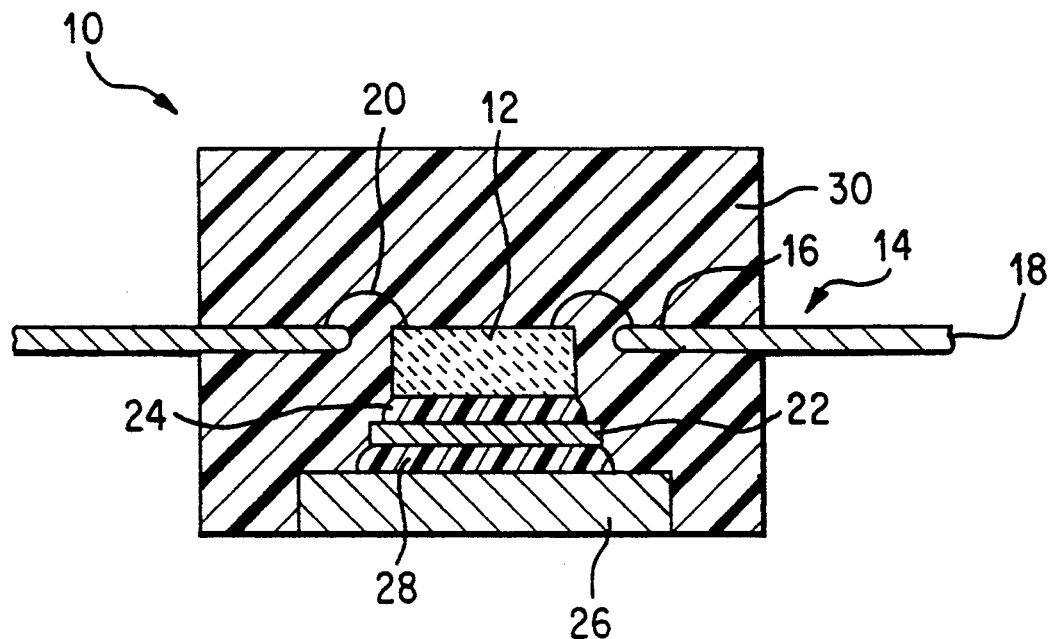
FIG. 1 shows in cross-sectional representation a molded plastic package incorporating a heat spreader as known from the prior art.

FIG. 1 shows in cross-sectional representation a molded plastic package 10 for encapsulating a semiconductor device 12 as known from the prior art. The molded plastic package 10 includes a leadframe 14 having a plurality of inner lead ends 16 and outer lead ends 18. The inner lead ends 16 are electrically interconnected to the semiconductor device 12 by bond wires 20. The bond wires 20 are small, typically on the order of 0.025 millimeter (0.001 inch), diameter wires manufactured from gold, copper or an alloy thereof. Alternatively, instead of bond wires, thin strips of copper foil such as utilized in tape automated bonding (TAB) may be utilized. The semiconductor device 12 is bonded to a die attach paddle 22 formed from the same material as the leadframe 14 and centrally positioned within an aperture defined by the inner lead ends 16. The semiconductor device 12 is joined to the die attach paddle 22 by a first bonding means 24 such as a low melting temperature solder (for example, alloys of gold and tin or of lead and tin) or a polymer adhesive. Preferably, if a polymer adhesive is used, the first bonding means 24 is made thermally conductive through the addition of a metal powder such as silver.

The die attach paddle 22 is then bonded to a heat spreader 26 by a second bonding means 28. The heat spreader 26 is usually fashioned from copper or a copper alloy to maximize thermal dissipation. As disclosed in the above-cited U.S. Pat. No. 5,015,803, the heat spreader 26 may be a composite material.

The second bonding means 28 may be any suitable solder or adhesive. As discussed above for the first bonding means, the second bonding means 28 may be filled with a metallic powder to enhance thermal dissipation.

The semiconductor device 12, inner lead ends 16, die attach paddle 22, first 24 and second 28 bonding means, as well as a portion of the heat spreader 26 are then encapsulated in a molding resin 30.

Figure 2:
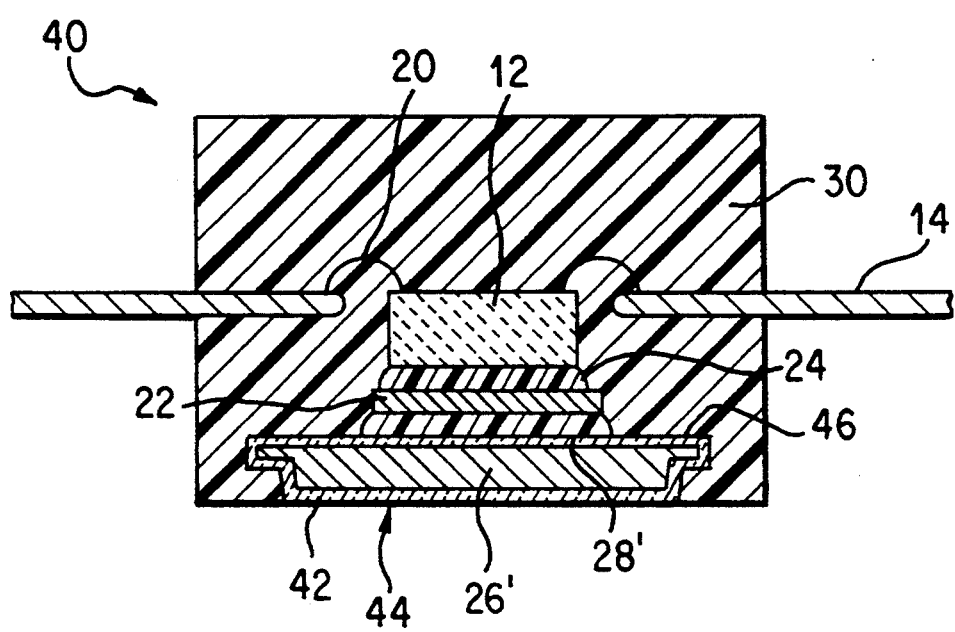
FIG. 2 shows in cross-sectional representation a molded plastic package incorporating an aluminum heat spreader in accordance with an embodiment of the invention.

A molded plastic electronic package 40 representing a first embodiment of the invention is illustrated in cross-sectional representation in FIG. 2. Those features of the molded plastic package 40 which perform substantially the same function as structures illustrated in FIG. 1 are identified by like reference numerals. Those features of the molded plastic package 40 which perform related functions in a different manner are indicated by primed reference numerals. An aluminum or aluminum alloy heat spreader 26' is, preferably, in thermal contact with a semiconductor device 12. By thermal contact, it is meant that the heat generated by the semiconductor device 12 can travel a continuous path to an external surface 44 of the aluminum or aluminum alloy heat spreader 26'. The heat is not required to pass through the molding resin 30.

The molding resin is a poor thermal conductor. Maintaining thermal contact between the device and heat spreader, in accordance with the preferred embodiments of the invention, improves thermal dissipation. The molding resin 30 should also only partially encapsulate the heat spreader 26'. The exterior surface 44 of the heat spreader 26' is, preferably, not encapsulated to maximize thermal convection of heat generated by the device to the surrounding environment. Although, a fully encapsulated heat spreader is within the scope of the invention.

The semiconductor device 12 is bonded to a die attach paddle 22 by means of a first bonding means 24. The second bonding means 28' joins the die attach paddle 22 to the aluminum or aluminum alloy heat spreader 26'. The second bonding means 28' may be a low melting temperature solder or polymer adhesive as known from the prior art or a thermally conductive grease or B-stage epoxy as described below.

The aluminum or aluminum alloy heat spreader 26' is anodized. An anodization layer 42 improves both corrosion resistance and adhesion to the molding resin 30. While the anodization layer may be any color or transparent, black (shades of black through gray) is preferred. Black radiates the most heat and is most effective for dissipating heat from the package to the surrounding environment. A black color also matches the typical color of resin. As a result, the infrared absorption characteristics of the package are not affected by the heat spreader. Reflow soldering to a printed circuit board is with the same temperature profile as used with packages lacking the heat spreader.

The black color may be formed by the addition of dyes or pigments, but the most durable color is formed by integral color anodization as disclosed in U.S. Pat. No. 5,066,368 to Pasqualoni et al. Following anodization, the coating layer may be sealed to close the pores inherent in anodization. One suitable sealing process is exposure to pressurized steam for 30–60 minutes. It may be preferred not to seal the pores as mechanical locking of the molding resin in the pores improves adhesion as described below.

The aluminum alloys most suitable for black integral color anodization are those designated by the ASM (American Society for Metals) as 3xxx and 6xxx series.

Alloys of the 3xxx series contain up to about 1.5 percent by weight manganese along with other alloying elements. The alloys are characterized by good thermal conductivity and about 20% higher strength than alloys designated as 1xxx series (having greater than 99.00% aluminum).

Alloys of the 6xxx series contain magnesium and silicon in an approximate proportion to form $Mg_2Si$. The alloys are characterized by good formability and good machinability. They are heat treatable and form a precipitation hardened alloy.

A most preferred aluminum alloy is aluminum alloy 3003 which has a nominal composition of about 0.12 percent by weight copper, about 1.2 percent by weight manganese and the balance aluminum. A black anodization layer may be formed by integral color anodization in an electrolyte containing a mixture of sulfuric and sulfosalicylic acids in a concentration range of from about 1–4 g/l $H_2SO_4$ and from about 50–120 g/l $C_7H_6O_6S$. The cell voltage is rapidly increased such that the current density increases from zero to over 7.53 $A/dm^2$ (70 ASF) within about 3 minutes. This anodization process is described in more detail in U.S. Pat. No. 5,066,368. The adhesion of the molding resin to the anodized heat spreader is further enhanced by mechanical locking. By proper control of the anodization parameters, pores of a desired size form in the anodization layer. A pore size of from about 50 to about 500 angstroms provides enhanced adhesion without weakening the strength of the layer. A preferred pore size is from about 75 to about 200 angstroms.

The minimum thickness of the anodization layer 42 is that effective to prevent corrosion of the heat spreader 26'. The anodization layer 42 should be as thin as possible while retaining effectiveness because the metal substrate is a better thermal conductor than the anodization layer. A preferred thickness for the anodization layer 42 is from about 0.0025 mm to about 0.076 mm (0.1–3 mils), with a preferred thickness being from about 0.013 mm to about 0.026 mm (0.5–1.0 mils).

The advantages of the aluminum or aluminum alloy heat spreader include a weight of about 60% less than that of a comparable copper or copper alloy heat spreader. Surprisingly, as disclosed in U.S. Pat. No. 4,939,316 to Mahulikar et al., the thermal dissipation of an electronic package with aluminum base components is comparable to that of a similarly configured package having copper base components. The reason for this is believed to be that the limiting factor for the dissipation of heat from the semiconductor device 12 to the surface 44 of the heat spreader 26' is thermal conduction through the first 24 and second 28' bonding means. Packages having an aluminum or aluminum alloy heat spreader are capable of removing approximately the same amount of heat from the device as a comparable package with a copper heat spreader.

The anodization layer 42 provides the heat spreader 26' with resistance to salt spray corrosion, as well as resistance to other corrosives. A black color provides better thermal conduction than a reflective metallic surface such as a copper, aluminum or nickel. Additionally, by varying the peak current density during anodization, controlled diameter pores may be formed in the surface of the anodization layer 42. These pores provide improved mechanical locking to the molding resin 30.

The improvement in adhesion when an aluminum heat spreader is anodized as compared to a non-anodized component is believed to be based on both a chemical interaction with the molding resin and mechanical locking. An anodized heat spreader has better adhesion than one which is not anodized. A rough anodization layer, achieved by varying the anodization parameters (i.e. current or solution make-up) provides better adhesion than a smooth anodized surface.

Another advantage of the anodization layer 42 is electrical isolation. The anodized aluminum heat spreader is electrically nonconductive. A semiconductor device mounted on the heat spreader will not be at the same voltage potential as the heat spreader and a voltage pulse contacting the outside of the package will not detrimentally affect the semiconductor device. Further, when the outer lead ends are electrolytically plated with solder, a typical operation following package molding, the electrically nonconductive heat spreader will not be coated with solder.

The adhesion of the heat spreader 26' to the molding resin is further improved by mechanical locking. As shown in FIG. 2, the corners of the upper surface 46 of the heat spreader 26' may extend beyond the corners of the bottom surface 44 such that the molding resin partially encapsulates the heat spreader. It is desirable that the bottom surface 44 remain exposed to the atmosphere to maximize the dissipation of heat. Other configurations may also be employed to mechanically lock the heat spreader in place in the epoxy molding resin, such as protrusions, holes or edge deformations.

The thermal dissipation of the molded plastic package 40 may be further improved by using as the second bonding means 28' a thermal grease or B-stage epoxy. The thermal grease 28' is any suitable thermally conductive grease such as a silicone grease. One exemplary thermal grease is Omegatherm 24 manufactured by Omega Engineering, Inc. of Stamford, Conn.

When the thermal grease is utilized, the die attach paddle 22 remains in thermal contact with the heat spreader 26', but is not bonded to it. As a result, the coefficient of thermal expansion mismatch between the heat spreader 26' and the semiconductor device 12 will not generate mechanical stresses on the semiconductor device 12. Any stresses generated by the coefficient of thermal expansion mismatch are compensated by movement of the die attach paddle. Thermal contact is maintained by corresponding movement of the thermal grease.

The advantages achieved through the thermal grease are not limited to aluminum heat spreaders and improve any electronic package having a coefficient of thermal expansion mismatch between the heat spreader and the semiconductor device. The grease is particularly useful for copper or copper alloy heat spreaders. To enhance adhesion, the copper heat spreaders are preferably coated with a second metal such as nickel as disclosed in U.S. Pat. No. 4,888,449.

Alternatively, the die attach paddle 22 may be bonded to the aluminum or aluminum alloy heat spreader 26' by a thermally enhanced B-stage adhesive such as a silver filled epoxy. The upper surface 46 of the heat sink 26' is precoated with a layer of a conductive adhesive 28' in the form of a film or thin layer of liquid and cured to the B-stage. By "B-stage" it is meant the epoxy is partially cured. Adhesion to the die attach paddle 26' occurs without completion of the cure reaction.

The heat sink 26' with the B-stage epoxy 28' laminated thereto is placed in a mold cavity. Next, the leadframe assembly which includes the semiconductor device 12 and die attach paddle 22 is placed into the mold. The leadframe assembly and the aluminum or aluminum alloy heat spreader 26' except for the bottom surface 44 are then encapsulated in molding resin 30 such as by injection molding. The molding resin is heated to decrease viscosity during molding and the heated resin either completes the cure or at least partially cures the B-stage adhesive 28'. Complete curing of the B-stage adhesive 28', if required, occurs during a post mold cure. One exemplary post mold cure is to heat the molded package to about 175° C. in air for several hours.

Preferred B-stage adhesives have a very low weight loss (i.e. the adhesive has little out gassing) so that air bubbles or voids do not form during the mold and post cure. The B-stage adhesive should also be very low stress, i.e., have a high degree of compliancy to compensate for the coefficient of thermal expansion mismatch between the aluminum or aluminum alloy heat spreader 26' and the semiconductor device 12. A preferred thickness for the B-stage adhesive is from about 0.025 mm to about 0.51 mm (0.001–0.020 inch), with a preferred thickness of from about 0.051 mm to about 0.25 mm (0.002–0.010 inch).

Figure 3:
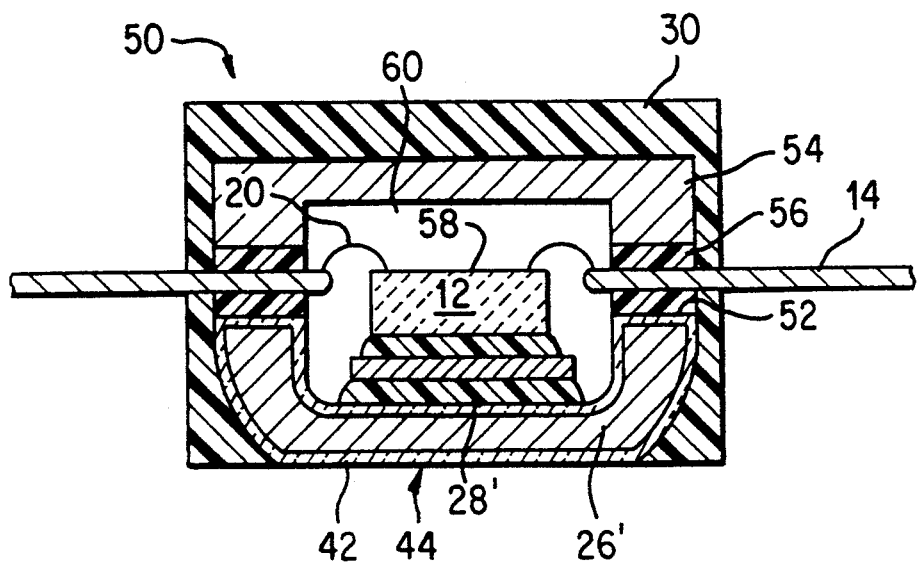
FIG. 3 shows in cross-sectional representation a molded plastic package incorporating an aluminum heat spreader in accordance with a second embodiment of the invention.

The molded plastic package 50 illustrated in cross-sectional representation in FIG. 3, represents another embodiment of the invention. In this embodiment, the aluminum or aluminum alloy heat spreader 26' which preferably includes a black integral color anodization layer 42, is bonded to the leadframe 14 by a third bonding means 52. The third bonding means 52 may be any suitable electrically insulating means such as a polymer adhesive. A preferred third bonding means 52 is an epoxy such as Abelstik 550 (Abelstik Laboratories, Gardenia, Calif.). Preferably, a cover 54 is bonded to the opposite side of the leadframe 14 by a fourth bonding means 56. The cover 54 may be fashioned from any suitable material such as ceramic, plastic, glass or metal. Most thermal dissipation is through the bottom surface 44 of the heat spreader 26' so the thermal conduction characteristics of the cover 54 are not critical. More importantly, the cover 54 should have a coefficient of thermal expansion approximately matching that of the heat spreader 26' to avoid flexure during package heating or cooling. In the preferred embodiment, the cover 54 is also formed from aluminum or an aluminum alloy.

The fourth bonding means may be any electrically insulating means such as a polymer adhesive. The assembly is then encapsulated within a molding resin 30 with the bottom surface 44 of the heat spreader 26' exposed to the atmosphere to maximize thermal dissipation. The advantage of this embodiment is that the electrically active face 58 of the semiconductor device 12 and the bond wires 20 do not contact the molding resin 30. During package encapsulation, the molding resin 30 is hot and traveling at high velocity. Contact with the electrically active face 58 may abrade the electrical circuits formed on that face or break bond wires 20.

After molding, the cured resin 30 has a coefficient of thermal expansion different than that of the semiconductor device 12. During temperature fluctuations, there is movement of the semiconductor device 12 relative to the molding resin 30. The cover 54 creates a cavity 60 protecting the electrically active face 58 of the semiconductor device 12, as well as the bond wires 20 from contact with the molding resin 30.

While an uncoated aluminum or aluminum alloy heat spreader may provide some of the advantages described above, the full advantage of the invention is achieved with an anodized aluminum heat spreader. A black integral color maximizes thermal conduction from the exposed face of the heat spreader. The anodization layer improves the adhesion between the heat spreader and the molding epoxy as is apparent from the Example which follows. The Example is intended to be illustrative and not limiting.

EXAMPLE

Figure 4:
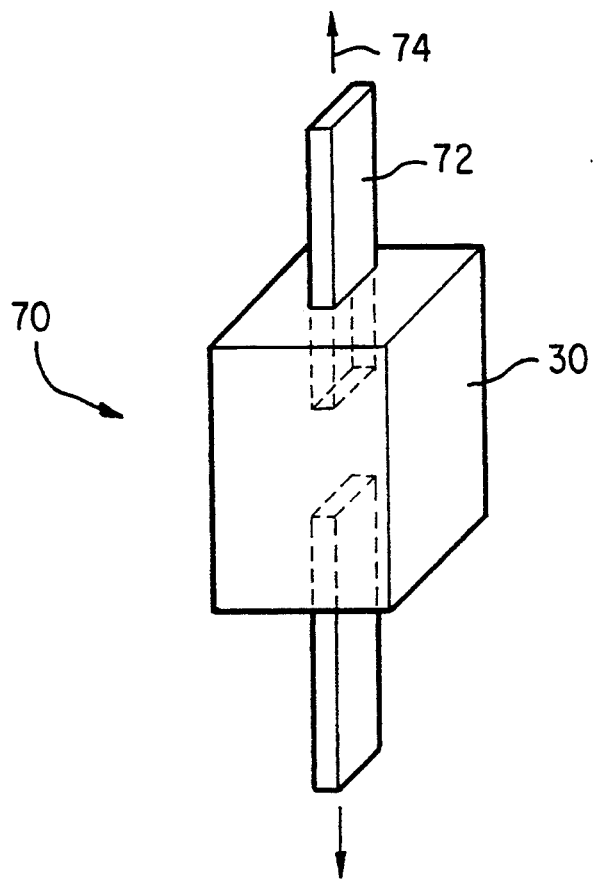
FIG. 4 shows a test apparatus for evaluating the adhesion of the molding resin to the aluminum heat spreader of the invention.

A test apparatus 70 as illustrated in FIG. 4 was prepared by partially encapsulating two aluminum alloy 3003 strips 72 in a block of molding resin 30. The strips 72 were pulled in opposing directions as illustrated by reference arrows 74 with an Instron tensile tester (Instron Corporation, Canton, Mass.). Test strips 72 were evaluated as both uncoated aluminum alloy 3003 and aluminum alloy 3003 with an integral color anodization layer. Other test strips 72 were encapsulated in the resin block and the molded assembly placed in a pressure cooker at 121° C. and 100% relative humidity. Exposure time to the pressure cooker was 96 hours. Table 1 indicates the force in pounds per square inch required to remove the test strips 72 from the block of molding resin 30.

TABLE 1

| Test Condition | Aluminum Alloy 3003 | | Anodized Aluminum Alloy 3003 | |
| --- | --- | --- | --- | --- |
| | Mean (psi) | Standard Deviation | Mean (psi) | Standard Deviation |
| As cured | 665 | 199 | 966 | 60 |
| 96 hours in pressure cooker | 594 | 187 | 838 | 88 |

Table 1 shows the adhesion of the molding resin 30 to an anodized aluminum heat strip 72 is at least 45% greater than the adhesion of the molding resin to an unanodized aluminum test strip. A similar improvement is observed after pressure cooker exposure.

An additional benefit is noted from the standard deviations recorded on Table 1. More consistent results are achieved after anodization, indicating that the uniform dispersion of surface pores created by integral color anodization presents more uniformity than achieved by the random surface of unprocessed metal.

While the embodiments of the invention described above include a single semiconductor device in thermal contact with the aluminum or aluminum alloy heat spreader, it is within the scope of the invention to have a plurality of semiconductor devices in thermal contact with a single heat spreader. For example, U.S. Pat. No. 5,124,783 to Sawaya, which is incorporated herein by reference in its entirety, discloses a circuit pattern mounted on a die attach paddle. A plurality of semiconductor devices are bonded to the die attach paddle and electrically interconnected to the circuit pattern. The thermal dissipation of the disclosed package would be greatly improved through the use of the heat spreaders of the present invention, thereby permitting the use of higher power semiconductor devices or a greater number or density of devices.

While the preferred embodiments of the invention are drawn to an anodization layer on an aluminum or aluminum alloy substrate, the beneficial effects of the adhesion promoting coating may be applied to other substrates as well. These other substrates include aluminum based composites such as aluminum-silcon carbide and aluminum based compounds such as aluminum nitride.

While the preferred embodiment of the invention is drawn to an anodization layer coating the aluminum or aluminum alloy heat spreader, other coatings which enhance adhesion are also believed to be beneficial. These coatings include chromium, zinc, mixtures of chromium and zinc as well as mixtures of chromium and phosphorous.

One exemplary alternative coating is a co-deposited layer of chromium and zinc. This coating is known to improves the adhesion of a molding resin to a copper or copper alloy substrate as disclosed in commonly assigned U.S. Pat. No. 5,300,158 by Chen et al. The preferred coatings as disclosed in U.S. Pat. No. 5,098,796 have a zinc to chromium ratio in excess of about 4 to 1.

The co-deposited chromium zinc layer does not provide electrical isolation as achieved by the anodization layer. The co-deposited layer could be deposited over the anodization layer to maintain electrical isolation. Alternatively, if electrical isolation is not necessary, the adhesion enhancing coating may be applied to any heat spreader.

The patents set forth in this specification are intended to be incorporated by reference herein.

It is apparent that there has been provided in accordance with this invention an anodized aluminum heat spreader which fully satisfies the objects, means and advantages set forth herein before. While the invention has been described in combination with specific embodiments thereof, it is evident that many alternatives, modifications and variations would be those apparent to those skilled in the art in light of the foregoing description. Accordingly, it is intended to embrace all such alternatives, modifications and variations as fall within the spirit and broad scope of the appended claims.

We claim:

1. A semiconductor package, comprising:
   at least one semiconductor device;
   a heat spreader formed from an aluminum based material and at least partially coated with an adhesion enhancing layer;
   a leadframe having a plurality of inner and outer leads, said inner leads electrically interconnected to said semiconductor device; and
   a molding resin encapsulating said semiconductor device, said inner leads of said leadframe and at least a portion of said heat spreader wherein said molding resin and said adhesion enhancing layer are the same color.

2. The semiconductor package of claim 1 wherein said heat spreader is formed from aluminum or an aluminum alloy.

3. The semiconductor package of claim 2 wherein said adhesion enhancing layer is selected from the group consisting of anodized aluminum, chromium, zinc, a mixture of chromium and zinc, and a mixture of chromium and phosphorous.

4. The semiconductor package of claim 3 wherein said adhesion enhancing layer is a co-deposited layer of chromium and zinc.

5. The semiconductor package of claim 4 wherein the ratio of zinc to chromium in said co-deposited layer is in excess of about 4:1.

6. The semiconductor package of claim 3 wherein said adhesion enhancing layer is a anodized aluminum.

7. The semiconductor package of claim 6 wherein both said molding resin and said adhesion enhancing layer have a gray to black color.

8. The semiconductor package of claim 7 wherein said heat spreader is formed from an aluminum alloy of the 3xxx or 6xxx series.

9. The semiconductor package of claim 8 wherein said heat spreader is formed from aluminum alloy 3003.

10. The semiconductor package of claim 8 wherein said adhesion enhancing layer is an integral color anodization layer.

11. The semiconductor package of claim 10 wherein said adhesion enhancing layer has an average pore diameter of from about 50 to about 500 angstroms.

12. The semiconductor package of claim 10 wherein said heat spreader is in thermal contact with said at least one semiconductor device.

13. The semiconductor package of claim 12 wherein a thermal grease maintains said at least one semiconductor device in thermal contact with said heat spreader.

14. The semiconductor package of claim 13 wherein a thermally enhanced polymer adhesive maintains said at least one semiconductor device in thermal contact with said heat spreader.

15. The semiconductor package of claim 14 wherein said thermally enhanced polymer adhesive is a silver filled epoxy.

16. A semiconductor package, comprising:
at least one semiconductor device;
a heat spreader formed from an aluminum alloy of the 3xxx or 6xxx series and at least partially coated with a black integral color anodization layer, said heat spreader being in thermal contact with said semiconductor device;
a leadframe having a plurality of inner and outer leads, said inner leads electrically interconnected to said at least one semiconductor device; and
a molding resin encapsulating said semiconductor device, said inner leads of said leadframe and all but one surface of said heat spreader wherein said molding resin and said anodization layer are the same color.

17. The semiconductor package of claim 16 wherein a thermal grease maintains said at least one semiconductor device in thermal contact with said heat spreader.

18. The semiconductor package of claim 16 wherein a thermally enhanced polymer adhesive maintains said at least one semiconductor device in thermal contact with said heat spreader.

19. A semiconductor package, comprising:
at least one semiconductor device;
a heat spreader formed from aluminum or an aluminum alloy and at least partially coated with an anodization layer, said heat spreader being in thermal contact with said semiconductor device;
a cover which in combination with said heat spreader shields said semiconductor device from a molding resin;
a leadframe disposed between and bonded to both said heat spreader and to said cover, said leadframe having a plurality of inner and outer leads, said inner leads electrically interconnected to said at least one semiconductor device;
a molding resin encapsulating said cover and at least a portion of said aluminum or aluminum alloy heat spreader.

20. The semiconductor package of claim 19 wherein said leadframe is bonded to both said heat spreader and to said cover by an epoxy.

21. The semiconductor package of claim 20 wherein both said molding resin and said anodization layer have a black color.

22. The semiconductor package of claim 21 wherein said heat spreader is formed from an aluminum alloy of the 3xxx or 6xxx series.

23. The semiconductor package of claim 22 wherein said anodization layer is an integral color anodization layer.

24. The semiconductor package of claim 22 wherein a thermal grease maintains said at least one semiconductor device in thermal contact with said heat spreader.

25. The semiconductor package of claim 22 wherein a thermally enhanced polymer adhesive maintains said at least one semiconductor device in thermal contact with said heat spreader.

26. A semiconductor package, comprising:
at least one semiconductor device;
a metallic heat spreader at least partially coated with a codeposited layer of chromium and zinc, said heat spreader being in thermal contact with said at least one semiconductor device;
a leadframe having a plurality of inner and outer leads, said inner leads electrically interconnected to said semiconductor device; and
a molding resin encapsulating said semiconductor device, said inner leads of said leadframe and a portion of said metallic heat spreader wherein said codeposited layer of chromium and zinc and said molding resin are the same color.

27. The semiconductor package of claim 26 wherein the ratio of zinc to chromium is in excess of about 4:1.

28. The semiconductor package of claim 26 wherein said metallic heat spreader is formed from anodized aluminum or an anodized aluminum alloy.

29. The semiconductor package of claim 26 wherein said metallic heat spreader is formed from copper or a copper alloy.

* * * * *